United States Patent
Han et al.

(10) Patent No.: US 9,651,867 B2
(45) Date of Patent: May 16, 2017

(54) COMPOUND AND COMPOSITION FOR FORMING LOWER FILM OF RESIST PATTERN, AND METHOD FOR FORMING LOWER FILM USING SAME

(71) Applicant: DONGJIN SEMICHEM CO., LTD., Incheon (KR)

(72) Inventors: Su-Young Han, Gyeonggi-do (KR); Jung-Youl Lee, Gyeonggi-do (KR); Jae-Woo Lee, Gyeonggi-do (KR); Jae-Hyun Kim, Seoul (KR)

(73) Assignee: DONGJIN SEMICHEM CO., LTD., Incheon (KR)

( * ) Notice: Subject to any disclaimer, the term of this patent is extended or adjusted under 35 U.S.C. 154(b) by 0 days.

(21) Appl. No.: 14/427,010

(22) PCT Filed: Sep. 12, 2013

(86) PCT No.: PCT/KR2013/008258
§ 371 (c)(1),
(2) Date: Mar. 10, 2015

(87) PCT Pub. No.: WO2014/042443
PCT Pub. Date: Mar. 20, 2014

(65) Prior Publication Data
US 2015/0286139 A1    Oct. 8, 2015

(30) Foreign Application Priority Data
Sep. 12, 2012 (KR) .................. 10-2012-0100898

(51) Int. Cl.
| | | |
|---|---|---|
| *G03F 7/11* | (2006.01) | |
| *H01L 21/027* | (2006.01) | |
| *G03F 7/09* | (2006.01) | |
| *G03F 7/00* | (2006.01) | |
| *G03F 7/16* | (2006.01) | |
| *G03F 7/40* | (2006.01) | |

(52) U.S. Cl.
CPC ............ *G03F 7/091* (2013.01); *G03F 7/0002* (2013.01); *G03F 7/168* (2013.01); *G03F 7/40* (2013.01); *H01L 21/0271* (2013.01)

(58) Field of Classification Search
CPC .............................. G03F 7/168; G03F 7/0002
See application file for complete search history.

(56) References Cited

U.S. PATENT DOCUMENTS

| | | | |
|---|---|---|---|
| 7,425,403 B2 | 9/2008 | Kishioka et al. | |
| 8,114,306 B2 | 2/2012 | Cheng et al. | |
| 9,063,424 B2 * | 6/2015 | Roh ......................... | G03F 7/091 |
| 2012/0164338 A1 * | 6/2012 | Roh ......................... | G03F 7/091 |
| | | | 427/385.5 |
| 2013/0288482 A1 * | 10/2013 | Nam ................... | H01L 21/0273 |
| | | | 438/703 |
| 2014/0287587 A1 | 9/2014 | Lee et al. | |

FOREIGN PATENT DOCUMENTS

| | | |
|---|---|---|
| KR | 1020100125199 A | 2/2011 |
| KR | 100886314 B | 9/2011 |
| KR | 10201000126190 A | 2/2012 |
| KR | 1020110042262 A | 7/2012 |
| KR | 1020100102451 A | 10/2012 |
| KR | 1020130034778 A | 5/2014 |
| WO | WO-2011/031123 a2 * | 3/2011 |

OTHER PUBLICATIONS

International Application No. PCT/KR2013/008258, International Preliminary Report on Patentability dated Mar. 17, 2015, six (6) pages, English translation attached, eight (8) pages.

* cited by examiner

*Primary Examiner* — Cynthia Hamilton
(74) *Attorney, Agent, or Firm* — Nath, Goldberg & Meyer; Tanya E. Harkins; Stanley N. Protigal

(57) ABSTRACT

Disclosed are a compound and composition for forming a lower film, which are used in a process for forming a resist pattern by means of the directed self-assembly of a block copolymer (BCP). Also disclosed is a method for forming a lower film using same. The compound for forming a lower film of a resist pattern according to the present invention has the structure of formula 1 of claim 1.

9 Claims, 5 Drawing Sheets

COMPOUND AND COMPOSITION FOR FORMING LOWER FILM OF RESIST PATTERN, AND METHOD FOR FORMING LOWER FILM USING SAME

FIELD OF THE INVENTION

This invention relates to a compound for forming a resist underlayer film, and more particularly to a compound and a composition for forming a resist underlayer film which is used at forming the resist pattern through a directed self assembly (DSA) lithography using a self-assembly of block copolymer (BCP), and method for the resist underlayer film using the same.

BACKGROUNDS OF THE INVENTION

A down-scale and higher integration degree of the semiconductor devices has required a technique for realizing fine circuit patterns. For this, there has been developed several studies including improvement of an exposure instrument or pattern forming method. The improvement of the exposure instrument has some drawbacks such as requiring considerable initial investment and reducing utilization of a conventional instrument. Thus, it is more preferred to improve the pattern forming method.

A directed self assembly (DSA) lithography using a self-assembly of a block copolymer (BCP), as one of improved pattern forming method, is expected to be capable of forming fine patterns having a line width of 20 nm and less than, which is known as the limit of a conventional optical pattern forming method. The DSA lithography, in which the conventional photoresist pattern process and an orientation characteristics of BCP are integrated, makes BCP oriented in a certain direction, thereby forming the fine resist patterns. In detail, in the DSA lithography, after forming the photoresist patterns (guide patterns) on a wafer or a thin film of ITO glass by using a conventional ArF, KrF or I-line photoresist composition, BCP is coated on spaces between the photoresist patterns and then heated to form the BCP coating layer. The BCP coating layer is subject to a heating treatment at a temperature over a glass transition temperature (Tg) and is rearranged (self-assembled or self-oriented). A part of the rearranged BCP is removed to obtain a self-assembled resist pattern with an ordered orientation (Please refer to Korean patent unexamined publication No. 10-2010-0126190, Korean patent application No. 1 0-201 1-0098838 filed on Sep. 29, 2011).

Generally an underlayer of the BCP should be a neutral layer in order to form fine patterns by the DSA lithography. Silicon wafers or ITO glasses used in a semiconductor process or LCD process have different polarity according to the materials thereof, and would hinder the self-assembly of the BCP, thereby making the formation of patterns difficult. For example, in case when the resist underlayer film is of nonpolar materials, a nonpolar part of BCP is adjacent to the resist underlayer film, and in case when in case when the resist underlayer film is of polar materials, a polar part of BCP is adjacent to the resist underlayer film. As a result, while a desirable lamella structure of perpendicular orientation is not formed, a lamella structure of parallel orientation is formed. Accordingly, it is necessary to form the neutral layer under the BCP for obtaining the desired lamella structure of perpendicularly oriented BCP.

For forming such neutral layer, hydroxyl terminated PS-r-PMMA(polystyrene-r-poly(methylmethacylate)) random copolymer, styrene homopolymer, or random copolymer of styrene and epoxy etc. was conventionally used as a compound having medium polarity between the polar part and the nonpolar part of BCP. When the neutral layer is made of PS-r-PMMA, the perpendicular orientation of BCP is possible, but the resist underlayer film should be silicon and as a drawback, high heating for several hours is required so as to form a mono layer of hydroxyl terminated PS-r-PMMA. Further, since the conventional neutral layer has low refractive index of about 1. 7, it is not proper as the resist underlayer film in a photoresist forming step using ArF exposure instrument. Accordingly, there is carried out a complicate process that either a neutral layer of 10 nm is spin-coated on a conventional antireflection coating (ARC) layer of 33 nm (in this case, the total thickness of the resist underlayer film is 43 nm), or a neutral layer is spin-coated on an antireflection coating (ARC) layer containing silicon, and then unreacted part of the neural layer is removed by dissolving in an organic solvent. Like this, in case of grapho-epitaxy method, the ARC layer must be additionally formed under the neutral layer.

SUMMARY OF THE INVENTION

Therefore, it is an object of the present invention to provide new compound and composition for forming a resist underlayer film which is used at forming the resist pattern forming process using a self-assembly of block copolymer (BCP).

It is another object of the present invention to provide a compound and a composition for forming a resist underlayer film positioned between a wafer and BCP, the resist underlayer film playing a role of an antireflection coating (ARC) layer as well as a neutral layer for excluding an effect from the wafer so that the self-assembly of BCP is not disturbed.

It is still another object of the present invention to provide a resist underlayer film especially useful for forming resist pattern by using a self-assembly of block copolymer (BCP), wherein the resist underlayer film is partially exposed and a polarity of the exposed part is changed so that the partial self-assembly of the resist pattern is possibly made.

It is still another object of the present invention to provide a method for forming a resist underlayer film and a method for forming fine resist patterns which make the resist pattern forming process simple, wherein the resist underlayer film can be formed for short-time and in simple manner and also an additional antireflection coating (ARC) layer is not needed.

In order to achieve these objects, the present invention provides a compound for forming a resist underlayer film, comprising a structure of following Formula 1.

[Formula 1]

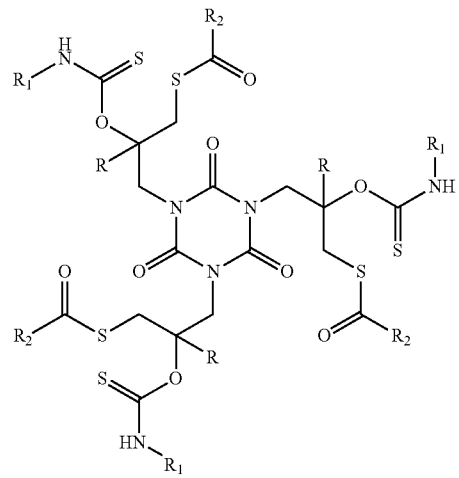

In Formula 1, R is independently a hydrogen atom or a methyl group, R₁ has at least one connecting bond, and is independently a chain-type or cyclic saturated or unsaturated hydrocarbonyl group having 1 to 15 carbon atoms which contain 0 to 6 hetero atoms, and R₂ is independently a chain-type or cyclic saturated or unsaturated hydrocarbonyl group having 1 to 15 carbon atoms which contain 0 to 15 hetero atoms.

Also, the present invention provides a composition for forming a resist underlayer film, comprising the compound for forming the resist underlayer film containing the structure represented by the Formula 1; and an organic solvent. Further, the present invention provides a method for forming the resist underlayer film, comprising a step of coating the composition for forming the resist underlayer film on a wafer, the composition comprising the compound for forming the resist underlayer film containing the structure represented by the Formula 1, and an organic solvent; and a step of removing the organic solvent from the composition coated to harden the resist underlayer film.

The compound and composition for forming the resist underlayer film according to the present invention enable the resist underlayer film which is used at forming the resist pattern process using a self-assembly of BCP, to be formed for short-time and in simple manner. The resist underlayer film formed according to the present invention plays a role of an antireflection coating (ARC) layer as well as a neutral layer for self-assembly of BCP.

DETAILED DESCRIPTION OF THE INVENTION

Figure 1:
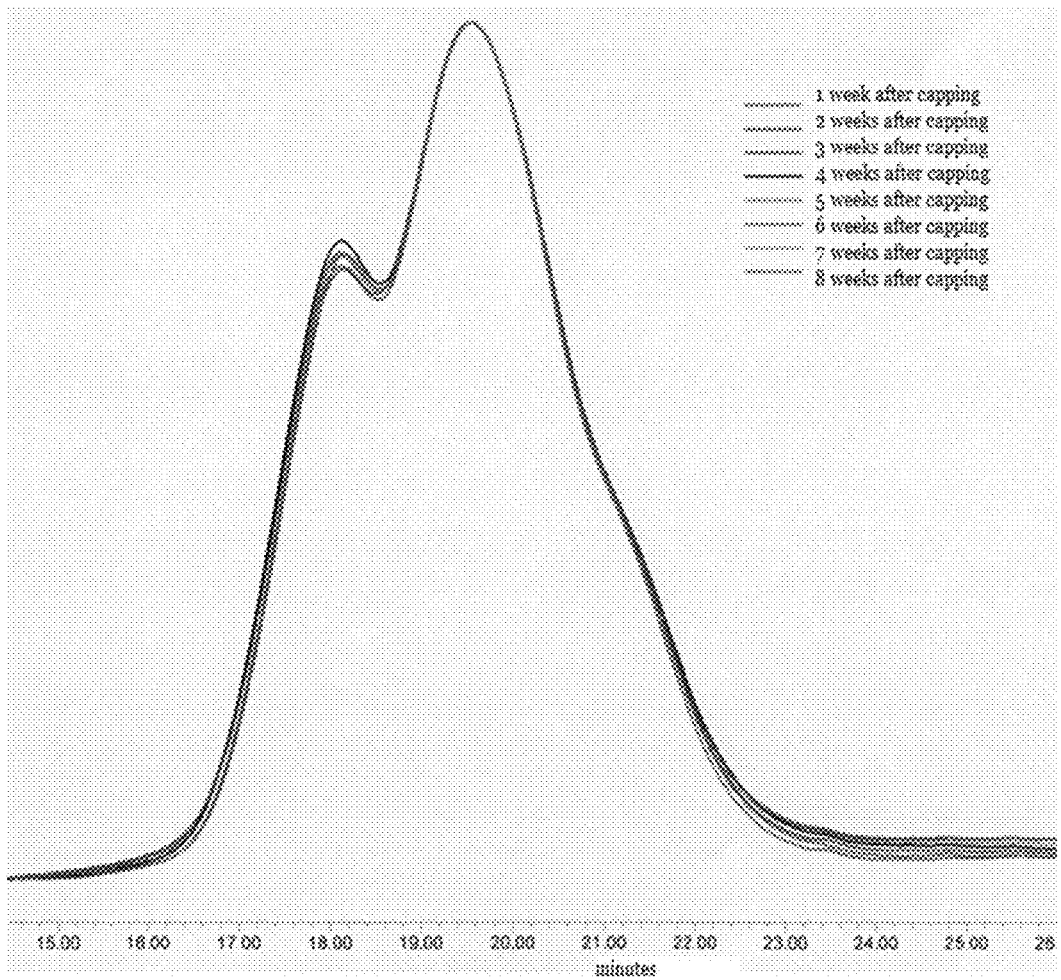
FIG. 1 is a GPC (Gel Permeation Chromatograph) graph showing molecular weight variation of compound which is prepared in Examples of the present invention, as time goes.

A more complete appreciation of the invention, and many of the attendant advantages thereof, will be better appreciated by reference to the following detailed description.

The compound for forming a resist underlayer film according to the present invention contains a structure of following Formula 1, and is used for forming the resist underlayer film located under the resist pattern which is formed through a directed self assembly (DSA) lithography using a self-assembly of block copolymer (BCP).

[Formula 1]

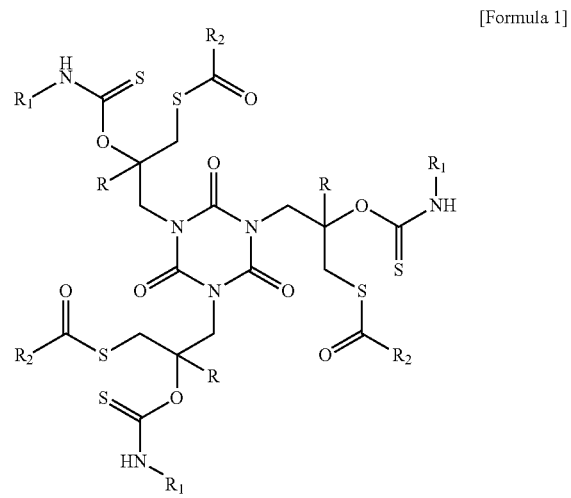

In Formula 1, R is independently a hydrogen atom or a methyl group, and R₁ has at least one connecting bond and is independently a chain-type or cyclic saturated or unsaturated hydrocarbonyl group having 1 to 15 carbon atoms which contain 0 to 6 hetero atoms, preferably a chain-type or cyclic saturated or unsaturated hydrocarbonyl group having 1 to 10 carbon atoms which contain 0 to 4 hetero atoms such as a nitrogen (N) atom, an oxygen (O) atom and/or a sulfur (S) atom. R₂ is independently a chain-type or cyclic saturated or unsaturated hydrocarbonyl group having 1 to 15 carbon atoms which contains 0 to 15 hetero atoms, preferably a chain-type or cyclic saturated or unsaturated hydrocarbonyl group having 3 to 10 carbon atoms, more preferably having 5 to 10 carbon atoms, which contains 0 to 8 hetero atom such as a nitrogen (N) atom, an oxygen (O) atom and/or a sulfur (S) atom. Where the connecting bond of R₁ is at least two, the rest excluding R₁ among at least two isocyanurate compounds represented by Formula 1 can be connected to the connecting bond of R₁. That is, at least two isocyanurate compounds represented by Formula 1 share one R₁. Like a such, the isocyanurate compound of Formula 1 is continuously combined with sharing R₁ to become a polymer compound for forming the resist underlayer film. Accordingly, only one isocyanurate compound of Formula 1 can serve as the compound for forming the resist underlayer film. Also, a polymer which is formed by combining at least two isocynurates in Formula 1 and whose total weight-average molecular weight (Mw) is preferably 2,000 to 10,000, more preferably 4,000 to 8,000 can serve as the compound for forming the resist underlayer film. When the bonding number of isocynurate compound is too many, it is worried that solubility of the compound for the resist underlayer film with respect to the solvent become low and an etching rate of the resist underlayer film is reduced in an etching process.

The example of R₁ includes alkyl group, aryl group, arylalkyl group, or alkylaryl group etc. which contains or do not contain hetero atoms such as

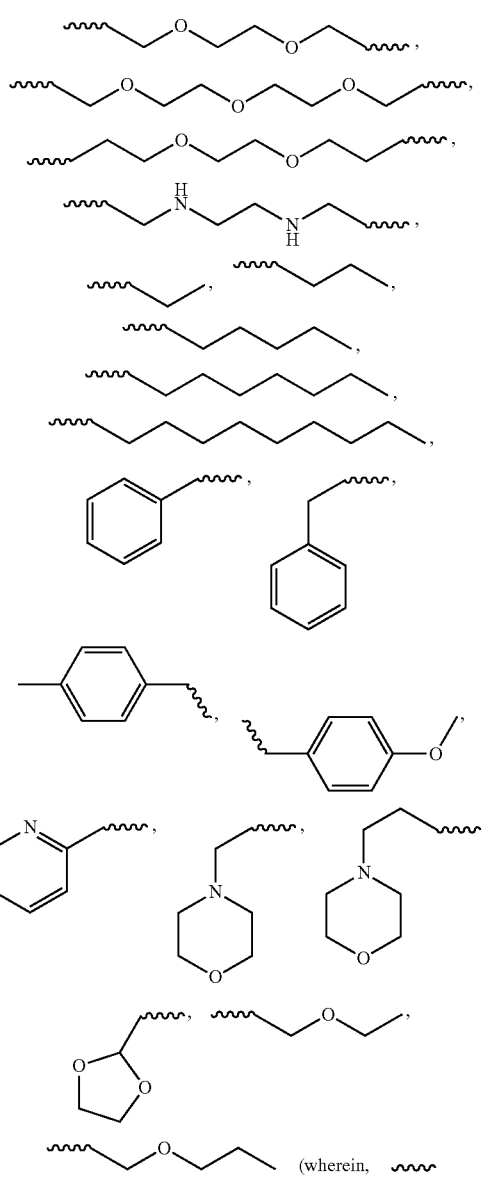

(wherein, ～～ indicates a connecting bond).

The example of R₂ includes alkyl group, aryl group, arylalkyl group, or alkylaryl group etc. which contains or do not contain hetero atoms such as

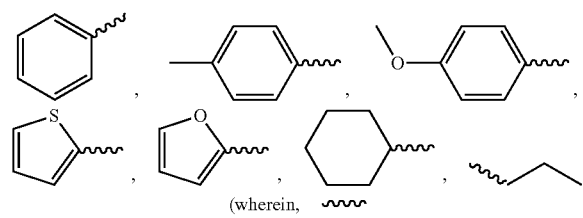

(wherein, ～～ indicates a connecting bond), —CF₃, —(CF₂)₃CF₃, etc.

The representative examples of isocyanurate compound represented by Formula 1 include compounds represented by following Formula 1a to Formula 1i.

[Formula 1a]

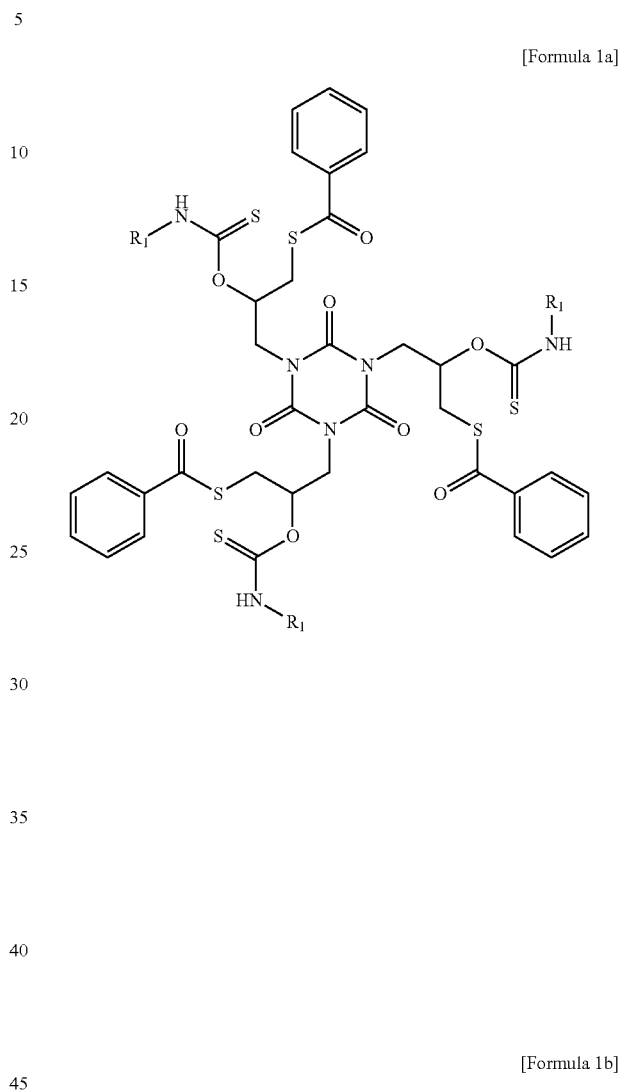

[Formula 1b]

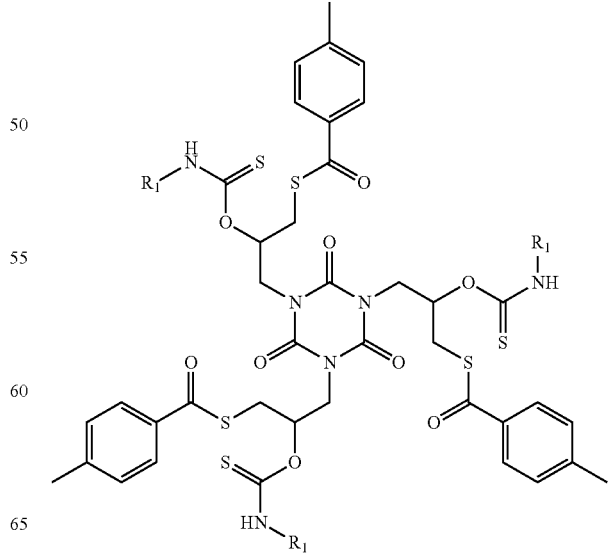

[Formula 1c]
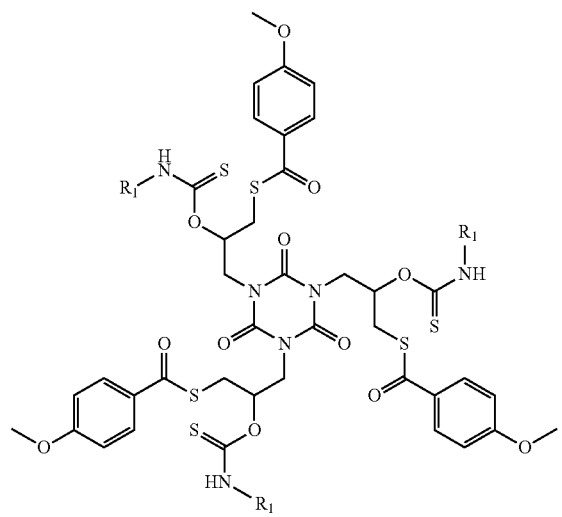
[Formula 1d]
[Formula 1e]
[Formula 1f]
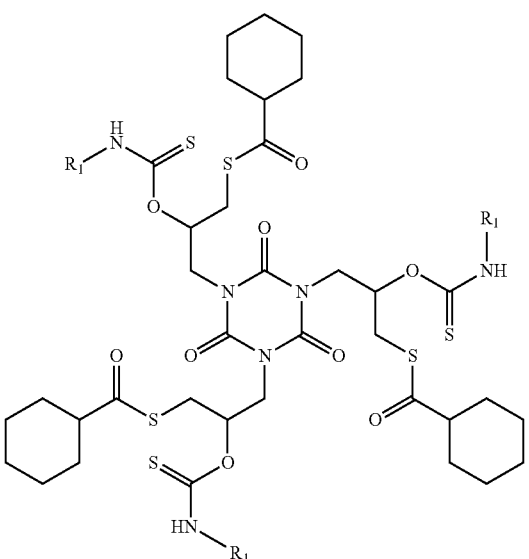
[Formula 1g]
[Formula 1h]
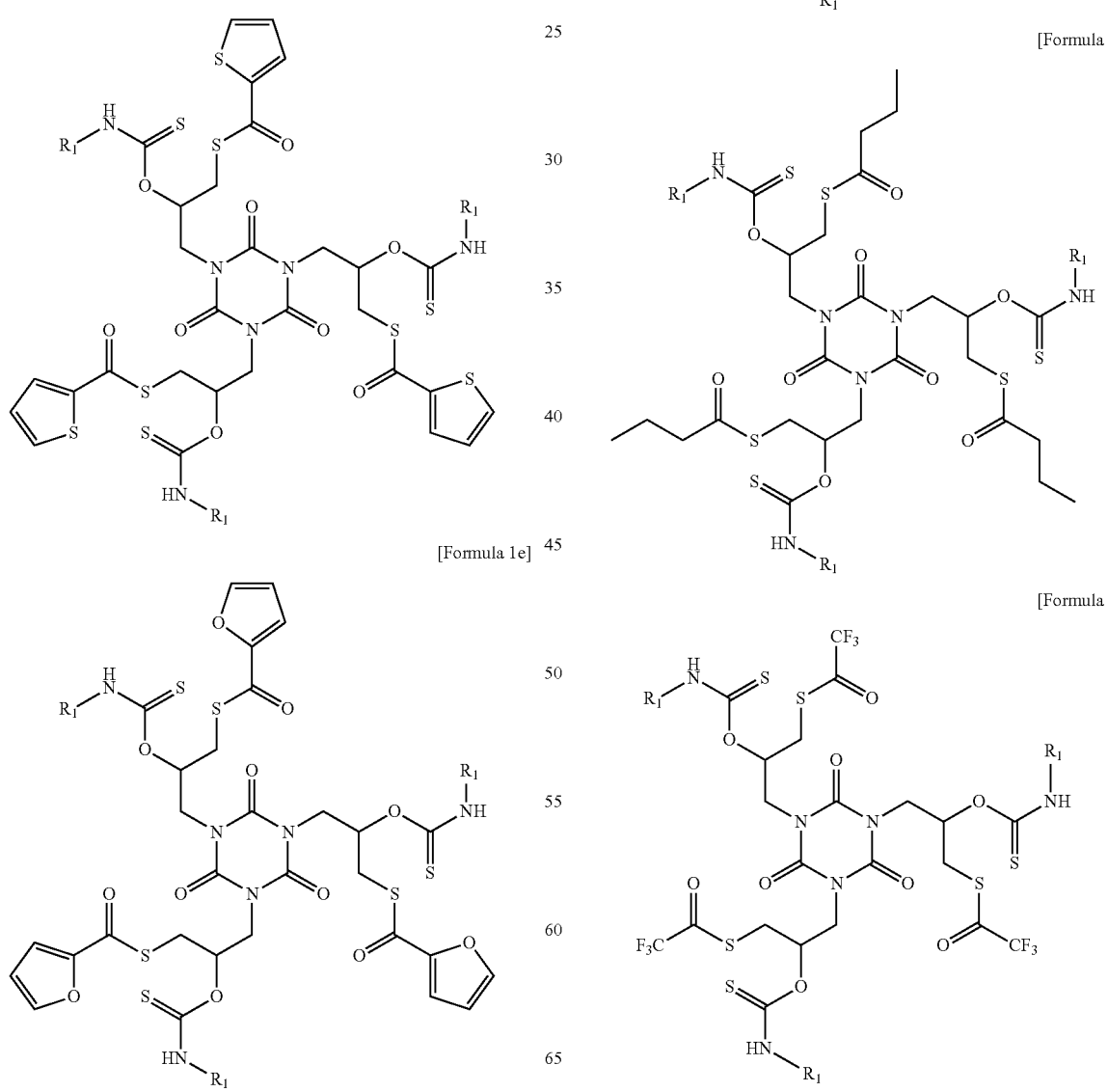

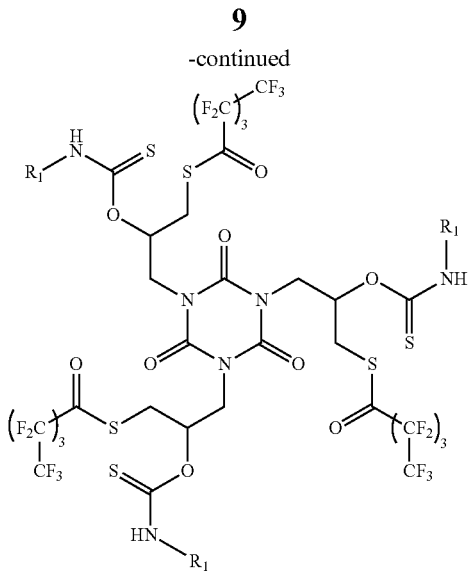

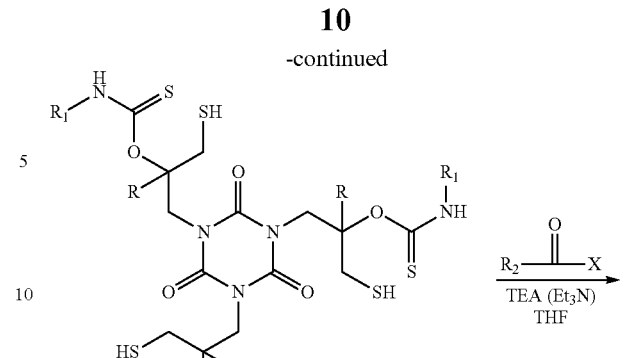

Formula 2

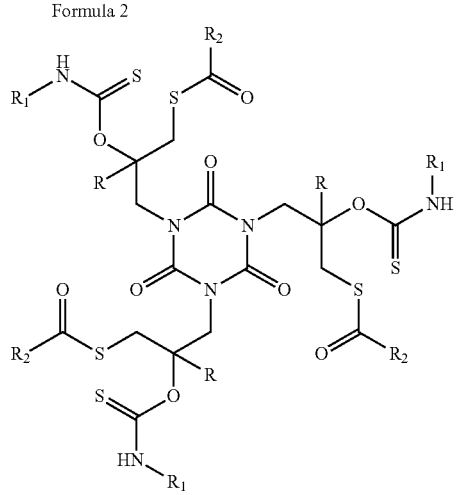

Formula 1

In Formula 1 a to Formula 1 i, $R_1$ is the same as defined in the Formula 1. Where the connecting bond of $R_1$ is at least two, at least two isocyanurate compounds represented by Formula 1a to Formula 1i can be connected with sharing $R_1$, to form polymer structure.

The isocyanurate compound represented by Formula 1 is prepared by, as shown in following Reaction 1, (i) reacting tris(1,3-oxathiolane-2-thion-5-ylmethyl)isocyanurate or tris(5-methyl-1,3-oxathiolane-2-thion-5-ylmethyl)isocyanurate with a compound containing at least one amine group (—$NH_2$) and $R_1$ for 15 to 30 hours under a solvent of dimethyl formamide (DMF) at room temperature (25° C.), to form an isocynurate compound represented by following Formula 2, then (ii) dissolving the isocynurate compound represented by following Formula 2 in tetrahysrofurane (THF), adding triethylamine (TEA), lowing a reaction temperature to 0° C., adding acyl halide compound or anhydride compound containing $R_2$ to react for 1 hours, and then again carrying out a reaction at room temperature (25° C.) for 10 to 24 hours.

In Reaction 1, R, $R_1$ and $R_2$ are the same as defined in Formula 1, X is a halide such as Cl, Br etc, m is an integer of 1 or more, for example 1 to 3, preferably 1 or 2.

Here, as the compound $$(R_1\!-\!\!\!-\!(NH_2)_m)$$

which contains at least one amine group (—$NH_2$) and $R_1$,

[Reaction 1]

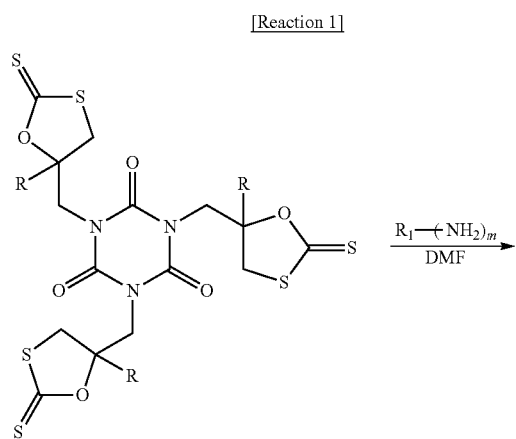

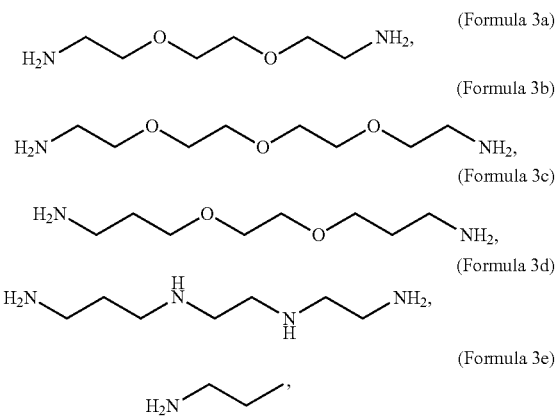

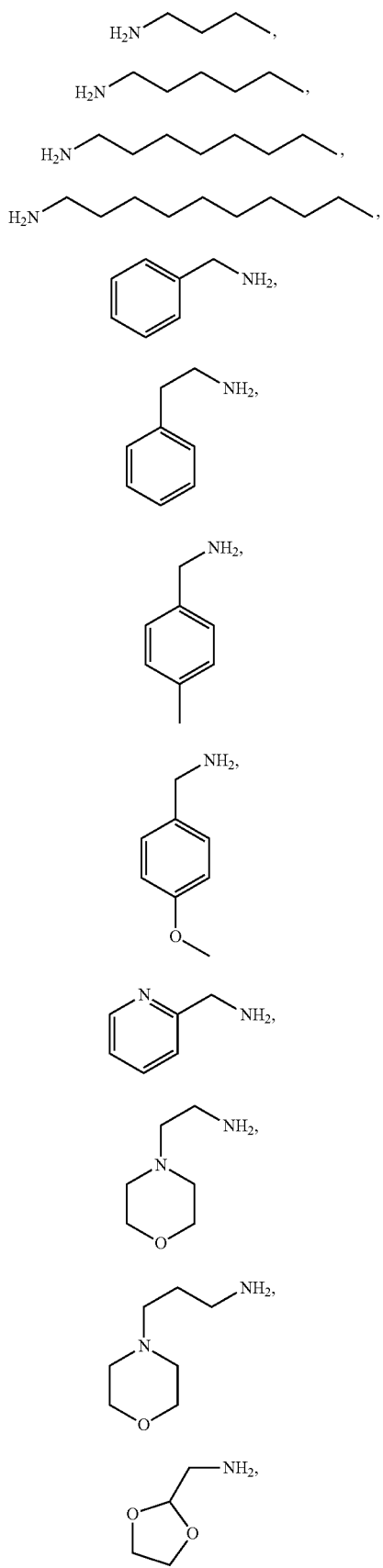

(Formula 3f)
(Formula 3g)
(Formula 3h)
(Formula 3i)
(Formula 3j)
(Formula 3k)
(Formula 3l)
(Formula 3m)
(Formula 3n)
(Formula 3o)
(Formula 3p)
(Formula 3q)

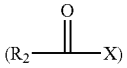 or (Formula 3r)

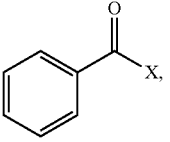 (Formula 3s)

alone or mixture thereof can be used. When m is 2 or more, the compound $$(R_1\!\!-\!\!(NH_2)_m)$$

reacts with at least two tris(1,3-oxathiolane-2-thion-5-ylmethyl)isocyanurate or tris(5-methyl-1,3-oxathiolane-2-thion-5-ylmethyl)isocyanurate so that the isocyanurate compounds represented by Formula 1 and Formula 2 turn into the polymer structure.

The example of the acyl halide or anhydride compound $$(R_2\!\!-\!\!\overset{O}{\underset{\|}{C}}\!\!-\!\!X)$$

which contains $R_2$ includes

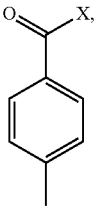 (Formula 4a)

(Formula 4b)

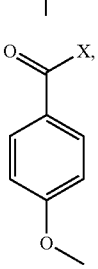 (Formula 4c)

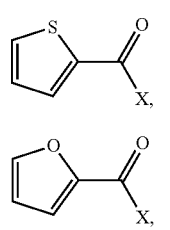 (Formula 4d)

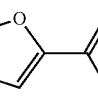 (Formula 4e)

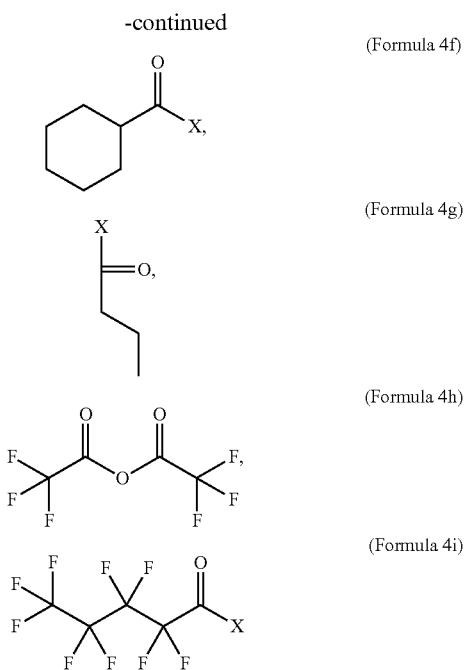

etc (In Formula 4a to Formula 4i, X is Cl or Br).

The composition for forming the resist underlayer film according to the present invention comprises the compound for forming the resist underlayer film which contains a structure of Formula 1 and an organic solvent, and if needed, the composition further comprises a cross-linking agent, an acid generator, and so forth. It is preferable to use the compound of polymer structure which is synthesized from the compound which contains at least two amine groups and $R_1$ or the compound of polymer structure which is cross-linked by the cross-linking agent during the formation of the resist underlayer film, as the compound for forming the resist underlayer film. The weight average molecular weight (Mw) of the compound for forming the resist underlayer film with polymer structure is preferably 2,000 to 10,000, more preferably 4,000 to 8,000. When the weight average molecular weight (Mw) of the compound is less than 2,000, the formed resist underlayer film may be dissolved in the solvent, and when the weight average molecular weight (Mw) of the compound is more than 10,000, solubility thereof to the solvent becomes low and an etching rate of the resist underlayer film may be reduced in a dry etching process. The amount of the compound for the resist underlayer film is 0.1 to 5 weight %, preferably 0.5 to 2 weight % with respect to total composition. When the amount of the compound for the resist underlayer film is less than 0.1 weight %, the resist underlayer film may not be formed, and when the amount of the compound for the resist underlayer film is more than 5 weight %, the physical properties such as an uniformity of the resist underlayer film may be degraded, and coating layer with desirable thickness may not be formed.

The cross-linking agent, which is to induce a cross-linking reaction of the underlayer compound and promote forming the polymer structure, may be any kind of general cross-linking agent without limitation so far as it cross-links the compound for the resist underlayer film, and for example melamine type cross-linking agent can be used. The amount of the cross-linking agent is 0.01 to 1 weight %, preferably 0.05 to 0.5 weight % with respect to total composition. When the amount of the cross-linking agent is less than 0.01 weight %, the resist underlayer film may not be smoothly formed, and when the amount of the cross-linking agent is more than 1 weight %, the polar property of the resist underlayer film is changed so that the photoresist pattern may not be formed in DSA pattern forming using BCP.

The acid generator used in the present invention, which is added to promote cross-linking reaction of the compound for the resist underlayer film, can be conventional acid generator. Examples of the acid generators include conventional sulfonium salt-based compound, iodonium salt-based compound or mixture thereof, preferably triphenylsulfonium nonaflate, dodecylbenzen sulfonic acid, paratoluenesulfonic acid, and mixture thereof. Amount of the acid generator is 0.01 to 0.25 weight %, preferably 0.05 to 0.2 weight % with respect to total composition. When the amount of the acid generator is less than 0.01 weight %, the amount of acid for the cross-linking reaction is insufficient and the resist underlayer film may not be formed, and when the amount of the acid generator is more than 0.25 weight %, fume is generated in a high-heating process to contaminate a manufacturing instrument.

The organic solvent used in the present invention is not specifically limited and may be any kind of organic solvent for forming the resist underlayer film. The specific examples of the organic solvent include cyclohexanone, cyclopentanone, butyrol actone, dimethylacetamide, dimethyl formamide, dimethylsulfoxide, N-methyl pyrrolidone (NMP), tetrahydro furfural alcohol, Propylene Glycol Monomethyl Ether (PGME), Propylene Glycol Monomethyl Ether Acetate (PGMEA), ethyl lactate or mixture thereof. As the amount of the organic solvent, amount capable of dissolving the composition for the resist underlayer film should be used. The amount of the organic solvent used is the rest (for example 93. 75weight % to 99.88 weight % with respect to total composition) excluding the amounts of the compound for the resist underlayer film, the cross-linking agent and the acid generator from the total composition.

The method for forming the resist underlayer film comprises the steps of coating the composition for forming the resist underlayer film on a substrate to be etched such as a silicon wafer, an aluminum or glass, and of removing the organic solvent from the coated composition for the resist underlayer film to harden the resist underlayer film. The step of coating the composition for the resist underlayer film is carried out by a conventional method such as a spin-coating or a roller-coating etc. The step of hardening the composition for the resist underlayer film is carried out by heating in a hot plate or a convection oven at generally 90 to 240° C., preferably 150 to 220° C., more preferably 180 to 210° C. When the heating temperature is less than 90° C., the organic solvent in the composition for the resist underlayer film may be not sufficiently removed, or the cross-linking reaction is not sufficient so that the resist underlayer film may be dissolved in the following photoresist composition coating step. When the heating temperature is more than 240° C., the resist underlayer film may be chemically unstable.

The resist pattern is formed by using a conventional directed self assembly (DSA) process, after forming the resist underlayer film according to the present invention. In detail, (a) the photoresist composition is coated on a substrate on which the resist underlayer film is formed, to form a photoresist layer, and then the photoresist layer is exposed and developed to form photoresist patterns (guide patterns or first patterns). (b) BCP solution in which BCP of polystyrene-block-polymethylmetacrylate is dissolved in the organic solvent, is coated between the photoresist patterns (guide patterns), and then the heating is carried out to form BCP coating layer. Next, (c) the substrate on which BCP coating layer is formed is subject to an annealing treatment at a temperature over a glass transition temperature (Tg) of BCP for 1 to for 600 minutes to obtain self-assembled patterns having directional property. (d) The self-assembled patterns are etched (for example, dry etching, $O_2$ RIE (reactive ion etching)) to form fine resist patterns. In the step (c), due to polar property of surface of the photoresist pattern, a relatively high polar part of BCP is adjacently located on the photoresist pattern and a relatively low polar part of BCP is away from the photoresist pattern so that BCP is self-assembled. In the etching step (d), the relatively high polar part of BCP (methylmetacrylate part) is removed to form fine resist patterns.

The resist underlayer film formed by the cross-linking of compound represented by Formula 1 is located between the substrate and the self-assembled BCP to serve as a neutral layer which excludes an effect from the substrate so that the self-assembly of BCP is not disturbed. Also, the resist underlayer film made of the compound represented by Formula 1 has high refractive index (generally 1.90 or more) so that it could sufficiently suppress a light reflection even if the thickness thereof is 30 nm or less, preferably 25 nm or less, more preferably 23 nm. Therefore, the resist underlayer film also plays a role of the antireflection coating (ARC) layer. Further, the resist underlayer film according to the present invention could be easily removed during an etching step using BCP resist pattern, after forming BCP resist pattern (conventionally, BCP resist patterns have a thickness of 100 nm or less).

As described above, the resist underlayer film of the present invention plays a role of the organic antireflection layer as well as the neutral layer, in a photoresist pattern forming step using the photolithography in which ArF (193 nm) eximer laser is used as an exposure source and the self-assembly of BCP. Thus the process for forming the resist underlayer film is simple and the time required for the process is shortened. In addition, the resist underlayer film of the present invention is partially exposed with a mask to change polar property thereof, so a partial self-assembly of the resist layer can be done. Like this, since the partial self-assembly of the resist layer is possible in a selective exposed region, there can be suppressed undesired patterns formation in a bulk region, which is a trouble in present DSA process of semiconductor pattern. Further, since the compound according to the present invention has little aromatic components, an etching rate is high and the thickness of the resist underlayer film can be reduced. Thus etching and exposing process can be carried out more easily.

Hereinafter, the present invention is more detail explained through specific examples and comparative examples. The following examples are provided for better understanding of the present invention. However, the present invention is not limited by the following examples.

EXAMPLE 1

Preparation of Compound for Resist Underlayer Film Represented by Formula 1a

A. Preparation of isocyanurate Compound Represented by Following Formula 5

5 g (0.0095 mol) of tris(1,3-oxathiolane-2-thion-5-ylmethyl)isocyanurate), 1.41 g (0.0095 mol) of compound

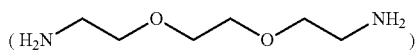

represented by Formula 3a, 3.46 g (0.0285 mol) of compound

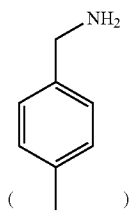

represented by Formula 31 and 55.91 g of DMF were mixed, and the mixture was reacted for 24 hours at room temperature (25° C.) with stirring to obtain the isocyanurate compound represented by following Formula 5 (Yield: 85%, weight-average molecular weight (Mw): 4,905, polydispersity index (PDI): 1.83). In following Formula 5, $R_1$ is

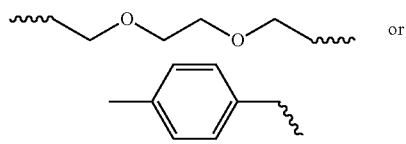

(mole ratio in total compound,

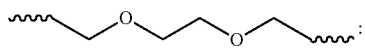

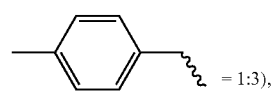

and when $R_1$ is

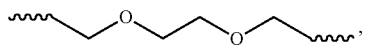

two isocyanurate compounds represented by following Formula 5 are connected to $R_1$

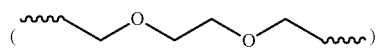

with sharing to form polymer.

[Formula 5]

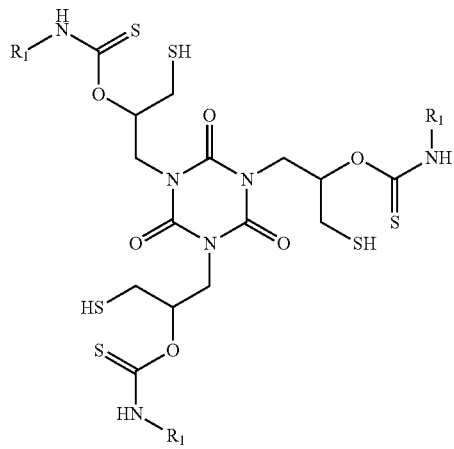

B. Preparation of isocyanurate Compound Represented by Following Formula 1a 76.29 g of THF was put into a 250mL round-bottomed flask, 10 g of compound represented by Formula 5 was added to dissolve, and 3.96 g of triethylamine (TEA) was added, and the temperature of the mixture was reduced to 0° C. by using ice-bath. 5.48 g of compound

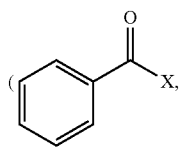

X is Cl.) represented by Formula 4a was slowly dripped to the solution, the reaction was performed for 30 minutes, the ice-bath is removed and further reaction was performed for 15 hours. After the completion of the reaction, the solid component was filtered out and remaining solution was precipitated in diethyl ether, filtered and dried, to obtain the isocyanurate compound represented by Formula 1a (Yield: 69.8%, Mw: 5,241, PDI: 1.84). In Formula 1a, $R_1$ is

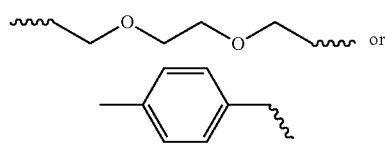

(mole ratio in total compound,

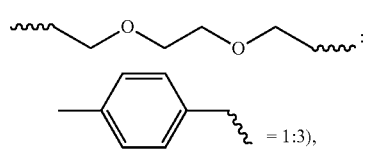

when $R_1$ is

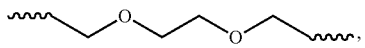

two isocyanurate compounds represented by following Formula 1a are connected to $R_1$

with sharing to form polymer.

EXAMPLE 2

Preparation of Compound for Resist Underlayer Film Represented by Formula 1b

The procedures were performed in the same manner as described in Example 1, excepting that 6.03 g of compound

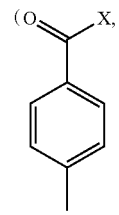

X is Cl) represented by Formula 4b was used rather than 5.48 g of the compound

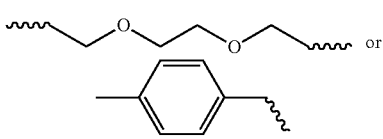

X is Cl) represented by Formula 4a to obtain compound for the resist underlayer film represented by Formula 1b (Yield: 73.0%, Mw: 5,581, PDI: 1.83). In Formula 1b, $R_1$ is

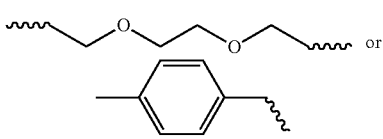

(mole ratio in total compound,

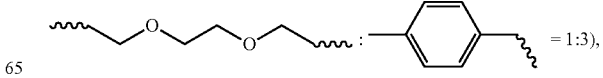

when R₁ is two isocyanurate compounds represented by following Formula 1b are connected to R₁ with sharing to form polymer.

EXAMPLE 3

Preparation of Compound for Resist Underlayer Film Represented by Formula 1c

The procedures were performed in the same manner as described in Example 1, excepting that 6.65 g of compound X is Cl) represented by Formula 4c was used rather than 5.48 g of the compound X is Cl) represented by Formula 4a to obtain compound for the resist underlayer film represented by Formula 1c (Yield: 66.7%, Mw: 5,751, PDI: 1.80). In Formula 1c, R₁ is or (mole ratio in total compound,

= 1:3), when R₁ is two isocyanurate compounds represented by following Formula 1c are connected to R₁ with sharing to form polymer.

EXAMPLE 4

Preparation of Compound for Resist Underlayer Film Represented by Formula 1d

The procedures were performed in the same manner as described in Example 1, excepting thst 5.74 g of compound X is Cl) represented by Formula 4d was used rather than 5.48 g of the compound X is Cl) represented by Formula 4a to obtain compound for the resist underlayer film represented by Formula 1d (Yield: 71.8%, Mw: 5,336, PDI: 1.86). In Formula 1d, R₁ is or (mole ratio in total compound,

= 1:3), when R₁ is two isocyanurate compounds represented by following Formula 1d are connected to $R_1$

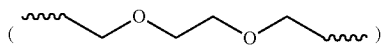

EXAMPLE 5

Preparation of Compound for Resist Underlayer Film Represented by Formula 1e

The procedures were performed in the same manner as described in Example 1, excepting that 5.11 g of compound

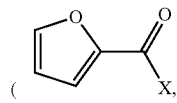

X is Cl) represented by Formula 4e was used rather than 5.48 g of the compound

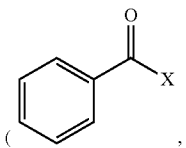

X is Cl) represented by Formula 4a to obtain compound for the resist underlayer film represented by Formula 1e (Yield: 78.6%, Mw: 5,121, PDI: 1.81). In Formula 1e, $R_1$ is

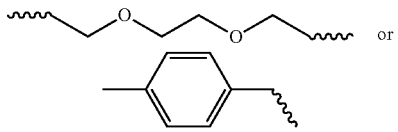

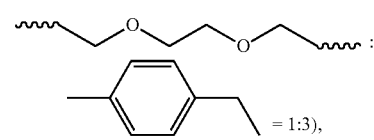

(mole ratio in total compound, when $R_1$ is

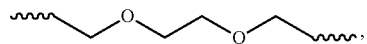

two isocyanurate compounds represented by following Formula 1e are connected to $R_1$

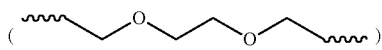

with sharing to form polymer.

EXAMPLE 6

Preparation of Compound for Resist Underlayer Film Represented by Formula 1f

The procedures were performed in the same manner as described in Example 1, excepting that 5.74 g of compound

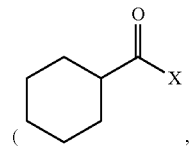

X is Cl) represented by Formula 4f was used rather than 5.48 g of the compound

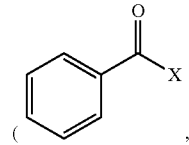

X is Cl) represented by Formula 4a to obtain compound for the resist underlayer film represented by Formula 1f (Yield: 62.2%, Mw: 4,908, PDI: 1.90). In Formula 1f, $R_1$ is

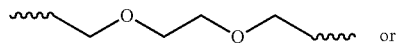

(mole ratio in total compound,

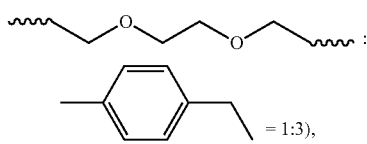

when $R_1$ is

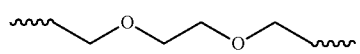

two isocyanurate compounds represented by following Formula 1f are connected to $R_1$

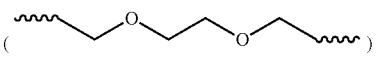

with sharing to form polymer.

EXAMPLE 7

Preparation of Compound for Resist Underlayer Film Represented by Formula 1g

The procedures were performed in the same manner as described in Example 1, excepting that 4.16 g of compound

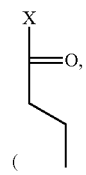

X is Cl) represented by Formula 4g was used rather than 5.48 g of the compound

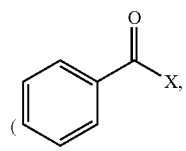

X is Cl) represented by Formula 4a to obtain compound for the resist underlayer film represented by Formula 1g (Yield: 62.2%, Mw: 5,218, PDI: 1.84). In Formula 1g, $R_1$ is

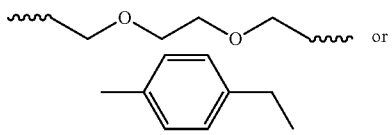
or (mole ratio in total compound,

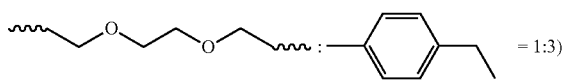
= 1:3)

when $R_1$ is

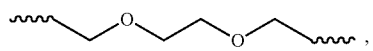, two isocyanurate compounds represented by following Formula 1g are connected to $R_1$

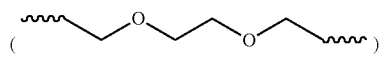

with sharing to form polymer.

EXAMPLE 8

Preparation of Compound for Resist Underlayer Film Represented by Formula 1h

The procedures were performed in the same manner as described in Example 1, excepting that 8.18 g of compound

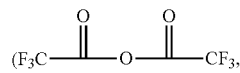

X is Cl) represented by Formula 4h was used rather than 5.48 g of the compound

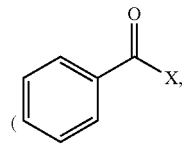

X is Cl) represented by Formula 4a to obtain compound for the resist underlayer film represented by Formula 1h (Yield: 72.5%, Mw: 5,664, PDI: 1.92). In Formula 1h, $R_1$ is

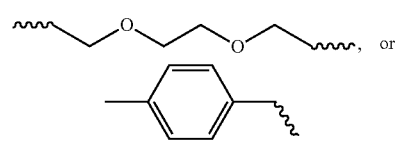, or (mole ratio in total compound,

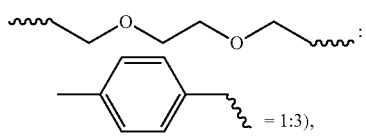 = 1:3), when $R_1$ is

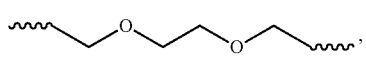, two isocyanurate compounds represented by following Formula 1h are connected to $R_1$

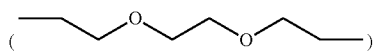

with sharing to form polymer.

EXAMPLE 9

Preparation of Compound for Resist Underlayer Film Represented by Formula 1i

The procedures were performed in the same manner as described in Example 1, excepting that 11.01 g of compound

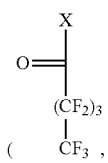

X is Cl) represented by Formula 4i was used rather than 5.48 g of the compound

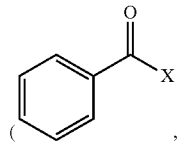

X is Cl) represented by Formula 4a to obtain compound for the resist underlayer film represented by Formula 1i (Yield: 68.4%, Mw: 6,344, PDI: 2.01). In Formula 1i, $R_1$ is

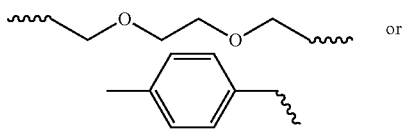

mole ratio in total compound,

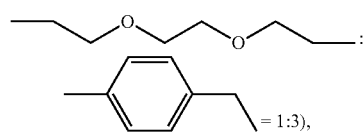

when $R_1$ is

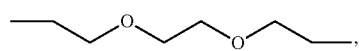

two isocyanurate compounds represented by following Formula 1i are connected to $R_1$

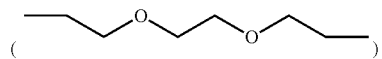

with sharing to form polymer.

COMPARATIVE EXAMPLE 1

Preparation of Compound for Resist Underlayer Film Represented by Formula 5

The compound for resist underlayer film represented by Formula 1 was prepared in accordance with A step of Example 1.

EXPERIMENTAL EXAMPLE

Stability Evaluation of the Compounds for Resist Underlayer Film

Figure 2:
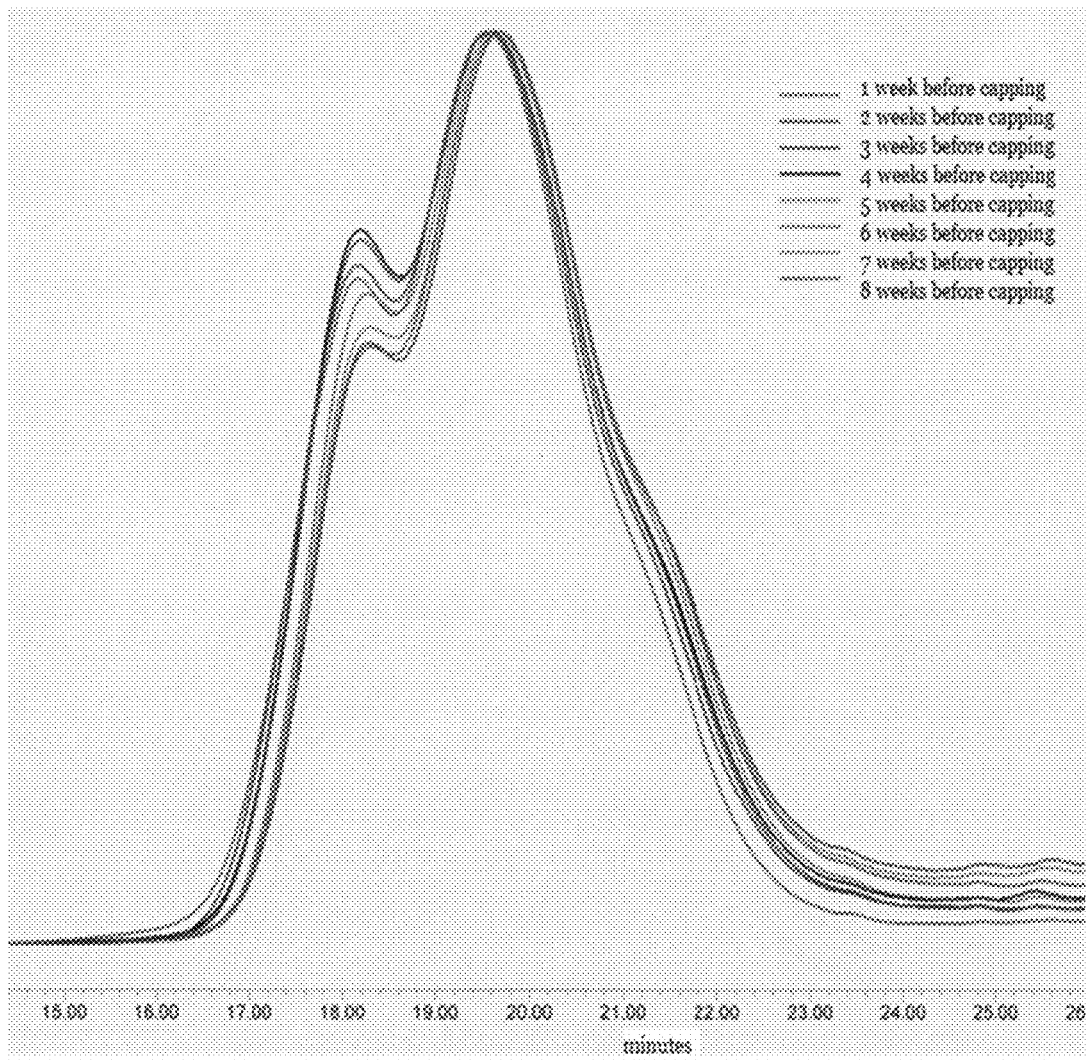
FIG. 2 is a GPC (Gel Permeation Chromatograph) graph showing molecular weight variation of compound which is prepared in Comparative Examples of the present invention, as time goes.

The compound prepared in Example 1 (Formula 1a, compound after capping) and the compound prepared in Comparative Example (Formula 5, compound before capping) were kept for two months at high temperature (40° C.). The molecular weight thereof was measured with GPC (Gel Permeation Chromatography) every one week, and the evaluation results thereof are shown in FIG. 1 and FIG. 2, respectively. From the GPC graphs in FIG. 1 and FIG. 2, we can recognize that the compound for resist underlayer film according to Example 1 of the present invention (Formula 1a) has very small variation of GPC graph according to time variation, so the compound according to Example 1 has high stability, while the compound for resist underlayer film according to Comparative Example 1 of the present invention (Formula 5) has relatively large variation of GPC graph according to time variation, so the compound according to Comparative Example 1 has relatively low stability. The compound represented by Formula 5 contains thiol group (—SH) to form disulfide bond at room temperature (25° C.) so that the stability of the compound represented by Formula 5 is low. However, in the compound represented by Formula 1a, thiol group (—SH) is capped and there is no reaction site so that the compound represented by Formula 1a has good stability even at room temperature (25° C.) or more.

EXAMPLES 10~27, COMPARATIVE EXAMPLE 2

Preparation of Composition for Forming Resist Underlayer Film and Formation of the Resist Underlayer Film In accordance with the content in following Table 1, 3 wt % of compounds for forming resist underlayer film (Formulas 1a to 1i) prepared in Examples 1 to 9, 0.2 wt % of a cross-linking agent (PL 1174, manufactured by Cytec Industries Inc.) and 0.1wt % of an acid generator (triphenylsulfonium nonaflate or tetrabutylammonium nonaflate) were dissolved in a mixing solution of Propylene Glycol Monomethyl Ether Acetate(PGMEA)/Propylene Glycol Monomethyl Ether(PGME) in the amount of 96.7 wt % and stirred, to prepare compositions for forming resist underlayer films (Examples 10 to 27). Also, a composition for forming resist underlayer film according to Comparative Example 2 was prepared by using same components in Examples 10 to 27 excepting that DARC-Al25 (Dongjin Semichem Co., Ltd.), a compound for forming an organic antireflection layer, was used as the compound for forming resist underlayer film. The composition for forming the resist underlayer film was spin-coated on parts to be etched in silicon wafer and baked for 60 seconds at 205° C. to form the resist underlayer film having 230 Å thickness.

The resist underlayer film formed was etched for 13 seconds with a dry etching gas ($CF_4$) and then etch rate (nm/second) thereof was measured by using a dielectric etcher (Exelan HPT, manufactured by Lam Research Corporation). The refractive index and absorption coefficient (k) of the resist underlayer film were measured by using ellipsometer (VUV-303, manufactured by J. A. Woolam). 5 μL of deionized water was dripped onto the resist underlayer film on the wafer and an average of contact angles over 5 seconds was measured by using a contact angle measuring instrument (DSA-100S, manufactured by KRUSS Gmbh). The results are shown in following table 1.

TABLE 1

| | Compound for resist underlayer film | (i) cross-linking agent/ (ii) acid generator/ (iii)solvent | Refractive index | Absorption coefficient | Etch rate | Contact angle (degree) |
|---|---|---|---|---|---|---|
| Example 10 | Formula 1a 3 wt % | (i) PL 1174 0.2 wt % (ii) triphenylsulfonium nonaflate 0.1 wt % (iii) PGMEA/PGME (7/3) 96.7 wt % | 1.96 | 0.42 | 12.8 | 78 |
| Example 11 | Formula 1b 3 wt % | | 1.97 | 0.43 | 12.5 | 78 |
| Example 12 | Formula 1c 3 wt % | | 1.96 | 0.42 | 13.4 | 76 |
| Example 13 | Formula 1d 3 wt % | | 1.98 | 0.40 | 14.0 | 76 |
| Example 14 | Formula 1e 3 wt % | | 1.97 | 0.39 | 13.6 | 75 |
| Example 15 | Formula 1f 3 wt % | | 1.97 | 0.29 | 14.2 | 81 |
| Example 16 | Formula 1g 3 wt % | | 1.96 | 0.28 | 14.5 | 73 |
| Example 17 | Formula 1h 3 wt % | | 1.98 | 0.27 | 13.5 | 84 |
| Example 18 | Formula 1i 3 wt % | | 1.95 | 0.30 | 13.8 | 87 |
| Example 19 | Formula 1a 3 wt % | (i) PL 1174 0.2 wt % (ii) tetrabutylammonium nonaflate 0.1 wt % (iii) PGMEA/PGME (7/3) 96.7 wt % | 1.94 | 0.42 | 12.6 | 77 |
| Example 20 | Formula 1b 3 wt % | | 1.94 | 0.42 | 12.7 | 79 |
| Example 21 | Formula 1c 3 wt % | | 1.93 | 0.40 | 12.9 | 79 |
| Example 22 | Formula 1d 3 wt % | | 1.97 | 0.41 | 12.5 | 77 |
| Example 23 | Formula 1e 3 wt % | | 1.96 | 0.41 | 13.4 | 76 |
| Example 24 | Formula 1f 3 wt % | | 1.95 | 0.26 | 13.8 | 83 |
| Example 25 | Formula 1g 3 wt % | | 1.92 | 0.25 | 13.9 | 74 |
| Example 26 | Formula 1h 3 wt % | | 1.96 | 0.28 | 13.0 | 85 |
| Example 27 | Formula 1i 3 wt % | | 1.95 | 0.27 | 13.1 | 86 |
| Comparative Example 2 | DARC-A125 | | 1.72 | 0.66 | 4.1 | 67 |

Form Table 1, we can recognize that the resist underlayer film according to the present invention has high refractive index even in light having a short wavelength of 193 nm and has high etch rate to be easily etched, and also the absorption coefficient of the resist underlayer can be modulated by varying capping materials of thiol group (—SH).

EXAMPLE 28~45, COMPARATIVE EXAMPLE 3

Formation of Photoresist Patterns

1300 Å of photoresist composition was coated on the resist underlayer films formed according to Examples 10 to 27, and soft-baked for 60 seconds at 110° C., to form photoresist layers. Wherein the photoresist composition comprises 5 g of photosensitive polymer

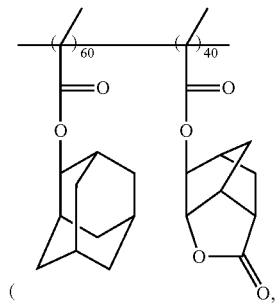

Mw=6,500, PDI=1.75)g, 0.2 g of triphenylsulfonium nonaflate, 0.02 g of trioctyl amine and 100 g of propylene glycol monomethyl ether acetate. The photoresist layer was exposed by using an exposing mask with line and space (L/S) pattern and a 193 nm ArF exposing instrument (ASML 1200B, 0.85NA), post-baked for 60 seconds at 110° C., and then developed with 2.38 wt % of TMAH (tetramethylammonium hydroxide) aqueous solution, thereby forming 1:2 line/space (L/S) pattern having 80 nm line width. Again, the formed pattern was subject to flood exposure with an exposing instrument, hard-baked for 60 seconds at 200° C., to form a first curing photoresist pattern (Examples 28~45). Also, a first curing photoresist pattern (Comparative Example 3) was formed on the resist underlayer film (organic antireflection coating layer, the thickness thereof was 330 Å) prepared according to Comparative Example 2 by using same manner in Example 28.

EXAMPLES 46~63, COMPARATIVE EXAMPLE 4

Formation of Self-Assembled Patterns

Figure 3:
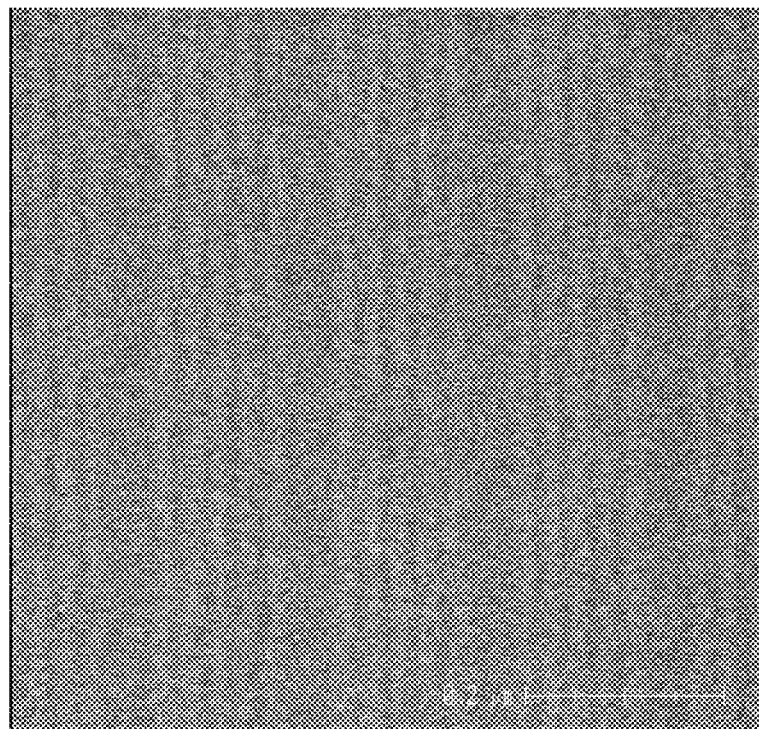
FIG. 3 is a photograph of scanning electron microscope (SEM) of a resist pattern prepared in Example of the present invention.
Figure 4:
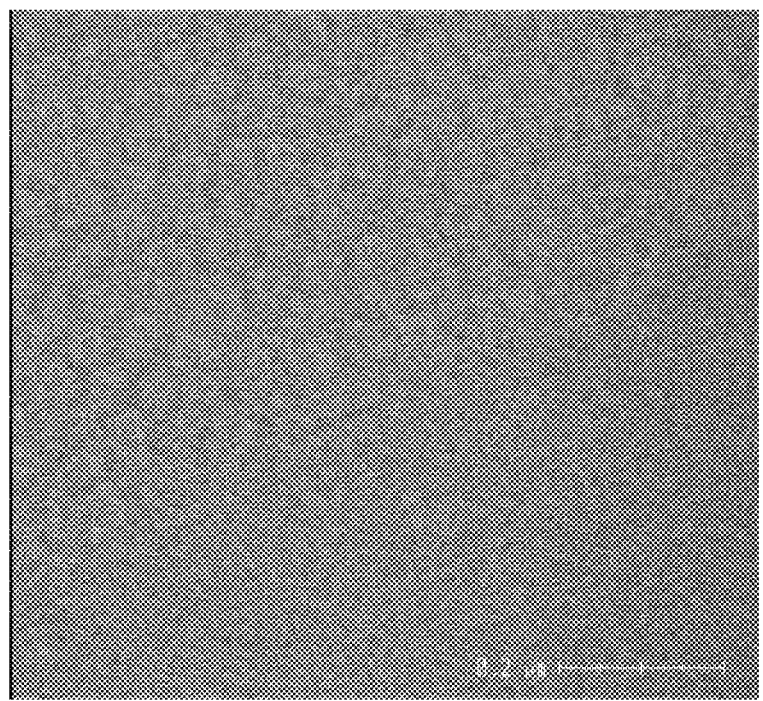
FIG. 4 is a photograph of scanning electron microscope (SEM) of a photoresist pattern prepared in Comparative Example of the present invention.

Composition comprising 2 wt % of PS-b-PMMA 25K-26K BCP dissolved in an organic solvent of PGMEA, was coated on the photoresist patterns formed in Examples 28~45 and Comparative Example 3 to form resist layers, and then the resist layers were annealed for 5 minutes at 200° C. (Examples 46~63, Comparative Example 4). Photograph (representative) of scanning electron microscope (SEM) of resist layers formed in Examples 46~63 and Comparative Example 4 are shown in FIG. 3 and FIG. 4, respectively. The annealing of the resist underlayer films in Examples 28~45 results in obtaining self-assembled lamella patterns of perpendicular orientation. However, in case of conventional organic antireflection coating layer(Comparative Example 3), self-assembled lamella patterns of perpendicular orientation cannot be obtained even though the annealing is applied (Comparative Example 4, FIG. 4). Accordingly, the resist underlayer film formed according to the present invention plays a role of a neutral layer for self-assembling the resist layers as well as the antireflection coating layer, so the process for forming the resist underlayer film in DSA lithography can be simplified.

EXAMPLES 64~81, COMPARATIVE EXAMPLE 5

Figure 5:
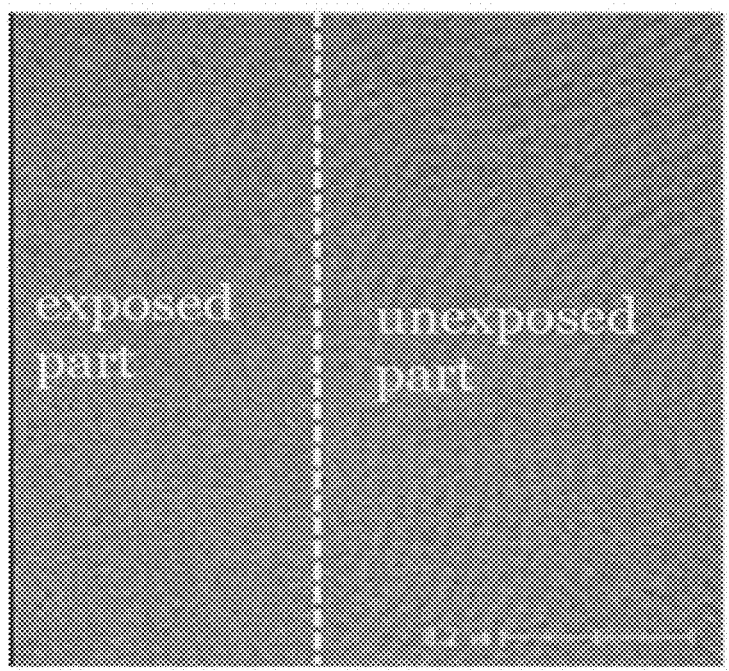
FIG. 5 is a photograph of scanning electron microscope (SEM) of a photoresist pattern formed on the resist underlayer film prepared in Example of the present invention, after partially modifying polar property of the resist underlayer film prepared in Examples of the present invention.
Figure 6:
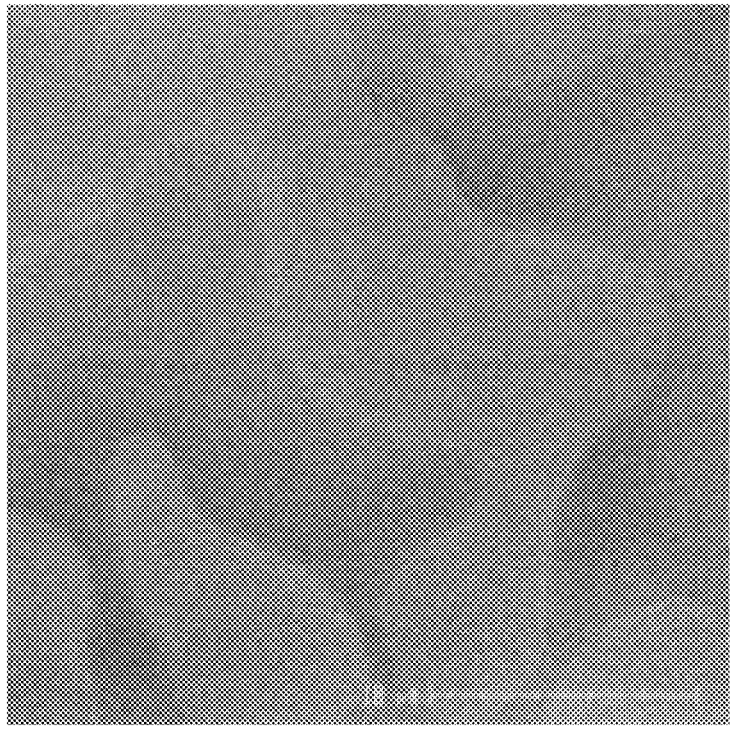
FIG. 6 is a photograph of scanning electron microscope (SEM) of a photoresist pattern formed on the resist underlayer film prepared in Comparative Examples of the present invention, after partially modifying polar property of the underlayer prepared in Comparative Example of the present invention.

Formation of Self-Assembled Patterns According to Polar property Change of the Resist Underlayer Film The resist underlayer film having 230 Å was formed on parts to be etched in a silicon wafer by using the compositions in Examples 10~27, and then soft-baked for 60 seconds at 205° C. The resist underlayer film was partially exposed by using 193 nm ArF exposing instrument (ASML 1200B, 0.85NA) and a predetermined mask, and developed with 2.38 wt % of TMAH (tetramethylammonium hydroxide) aqueous solution, thereby changing polar property of the resist underlayer film. No thickness variation of the resist underlayer film after developing was observed. The developed wafer was subject to hard-baking for 60 seconds at 200° C. to remove remaining water. Composition comprising 2 wt % of PS-b-PMMA 18K-186K BCP dissolved in an organic solvent of PGMEA, was coated on the resist underlayer film whose polar property was partially changed, to form resist layers, and then the resist layers were annealed for 5 minutes at 200° C. (Examples 64~81). Photograph (representative) of scanning electron microscope (SEM) of resist layers formed in Examples 64~81 are shown in FIG. 5. As shown in FIG. 5, in an exposed part in the resist underlayer film, polar property thereof is changed, so perpendicular lamella patterns owing to self-assembly of BCP are not formed. On the contrary, in an unexposed part in the resist underlayer film, polar property thereof is not changed, so perpendicular lamella patterns owing to self-assembly of BCP are formed. Also, a resist underlayer film was formed by using composition of Comparative Example 2 and was subject to partial exposure in same manner of Example 64, to form a resist layer (Comparative Example 5). Photograph of scanning electron microscope (SEM) of resist layer formed in Comparative Example 5 is shown in FIG. 6. As shown in FIG. 6, in case of conventional organic antireflection coating layer, no perpendicular lamella patterns are observed in both an exposed part and an unexposed part.

Figure 7:
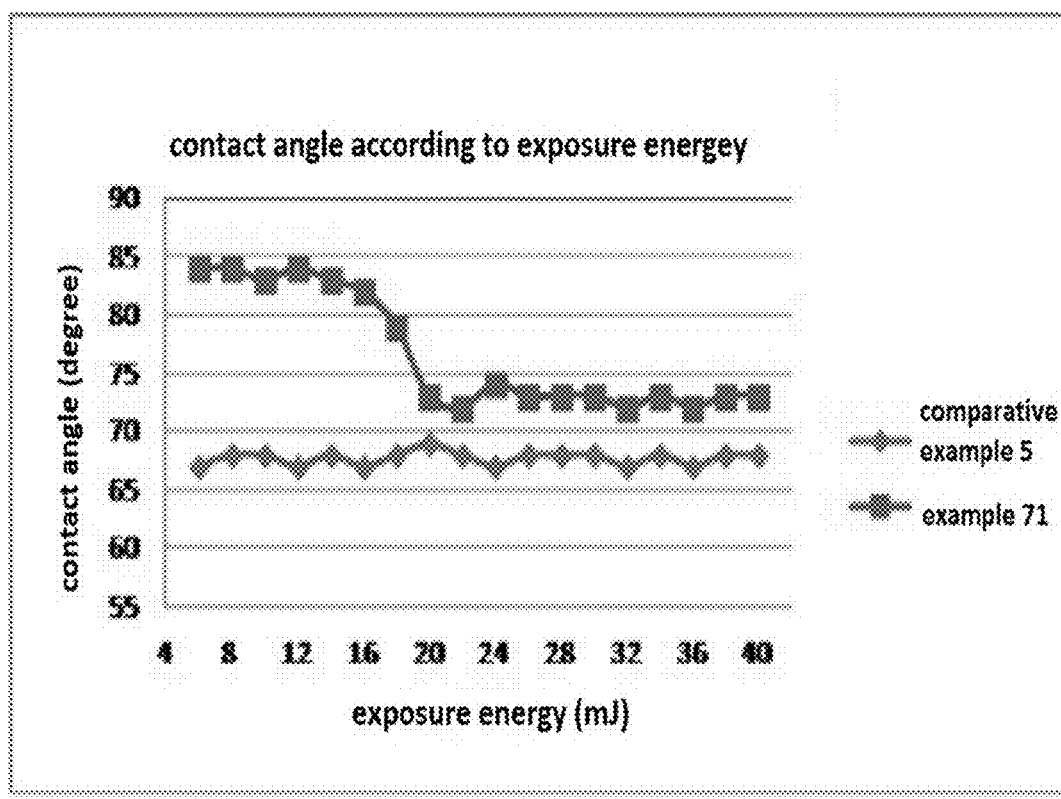
FIG. 7 is a graph showing a contact angle variation according to exposure energy of the resist underlayer film prepared in Example 71 and Comparative Example 5 of the present invention.

If only BCP is coated on a wafer and heated, BCP is self-assembled. However, for example, in case where polystyrene(PS)-poly(methylmethacylate)(PMMA) BCP is self-assembled in lamella pattern on a surface of substrate having polar property such as a general silicon wafer, BCP is not perpendicularly self-assembled but parallel self-assembled, thus such a BCP cannot be used in a semiconductor manufacturing process. The reason of parallel orientation of BCP is that when the wafer has polar property, BCP is alternatively assembled in the order of PMMA-PS-PMMA-PS with laying PMMA on a bottom and when the wafer has no polar property, BCP is alternatively assembled in the order of PS-PMMA-PS-PMMA with laying PS on a bottom. Accordingly, in order to form perpendicular lamella patterns which are useful in the semiconductor manufacturing process, BCP should be coated on a neutral layer (resist underlayer film) having middle value of polarity between PS and PMMA. At this time, it is possible to indirectly determine whether the resist underlayer film formed is eligible for the neutral layer capable of making perpendicular orientation of BCP, by measuring a contact angle of the formed neutral layer (resist underlayer film). Here, contact)angles (°) of the resist underlayer films formed in Examples 71 and Comparative Example 5 according to an exposing energy were measured, and the results thereof are presented in FIG. 7. As shown in FIG. 7, the variation of contact angles according to the exposing energy is observed in the resist underlayer films of the present invention, while no variation of contact angles according to the exposing energy is observed in the conventional resist underlayer film. Also from FIG. 7, we can recognize that in case where the exposing energy is 16 mJ or less, the contact angle is large and perpendicular lamellar pattern is formed, while the exposing energy is 16 mJ or more, the contact angle is small and parallel lamellar pattern is formed so that perpendicular DSA patterns used in the semiconductor manufacturing process cannot be formed.

As described above, since the contact angle can be varied according to the exposing energy strength, it is possible to selectively form DSA patterns in a bulk regions and a pattern forming region during the formation of semiconductor patterns. Accordingly, it is possible to induce perpendicular orientation of BCP only in the pattern forming region and to induce parallel orientation of BCP in the bulk region. In summary, according to the present inventions, self-assembled perpendicular lamellar pattern can be selectively made only in the pattern forming region.

What is claimed is:

1. A compound for forming a resist underlayer film, comprising a structure of following formula 1:

[Formula 1]

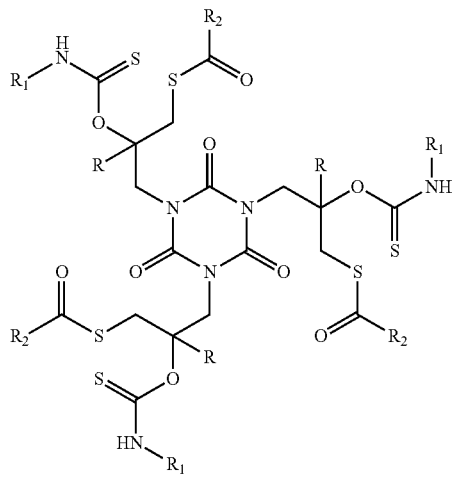

wherein in Formula 1, R is independently a hydrogen atom or a methyl group, $R_1$ has at least one connecting bond, and is independently a chain or cyclic saturated or unsaturated hydrocarbonyl group having 1 to 15 carbon atoms which contain 0 to 6 hetero atoms, and $R_2$ is —$CF_3$ or —$(CF_2)_3CF_3$.

2. The compound as claimed in claim 1, wherein at least two structures of Formula 1 are connected to form a polymer in a manner that $R_1$ has at least two connecting bonds and at least two structures of formula 1 except $R_1$ are connected to the $R_1$ by the connecting bonds.

3. The compound as claimed in claim 2, wherein total weight-average molecular weight (Mw) of the compound for forming the resist underlayer film is 2,000 to 10,000.

4. The compound as claimed in claim 1, wherein $R_1$ is a chain or cyclic saturated or unsaturated hydrocarbonyl group having 1 to 10 carbon atoms which contain 0 to 4 of a nitrogen (N) atom, an oxygen (O) atom and/or a sulfur (S) atom.

5. The compound as claimed in claim 1, wherein $R_1$ is selected from a group consisting of

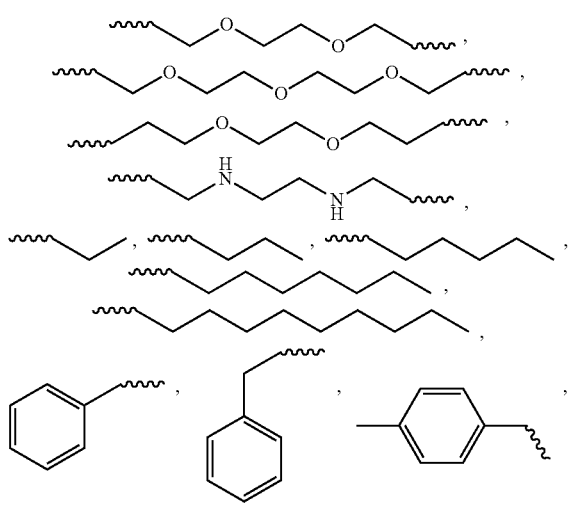

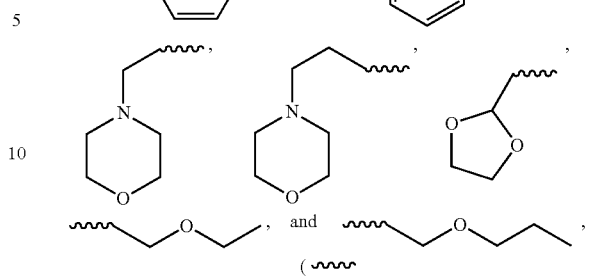

indicates connecting bond).

6. A composition for forming a resist underlayer film, comprising:
an organic solvent; and
a compound for forming the resist underlayer film, comprising a structure of following formula 1:

[Formula 1]

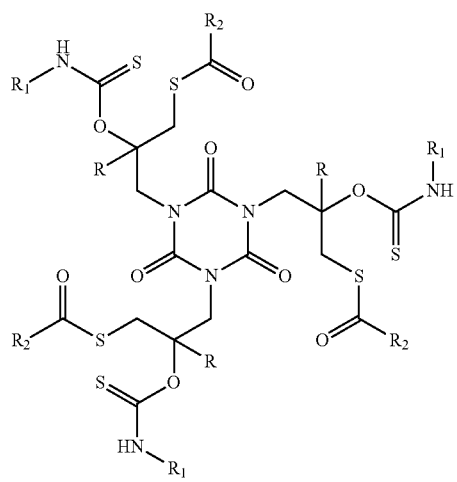

wherein in Formula 1, R is independently a hydrogen atom or a methyl group, $R_1$ has at least one connecting bond, and is independently a chain or cyclic saturated or unsaturated hydrocarbonyl group having 1 to 15 carbon atoms which contain 0 to 6 hetero atoms, and $R_2$ is —$CF_3$ or —$(CF_2)_3CF_3$.

7. The composition as claimed in claim 6, further comprising a cross-linking agent and an acid generator.

8. The composition as claimed in claim 7, wherein with respect to total composition, an amount of the compound for forming the resist underlayer film is 0.1 to 5 wt %, an amount of the cross-linking agent is 0.01 to 1 wt %, an amount of the acid generator is 0.01 to 0.25 wt %, and the rest belongs to the organic solvent.

9. A method for forming a resist underlayer film, comprising the steps of:
on a substrate, coating a composition comprising an organic solvent; and
a compound for forming the resist underlayer film, comprising a structure of following formula 1:

[Formula 1]

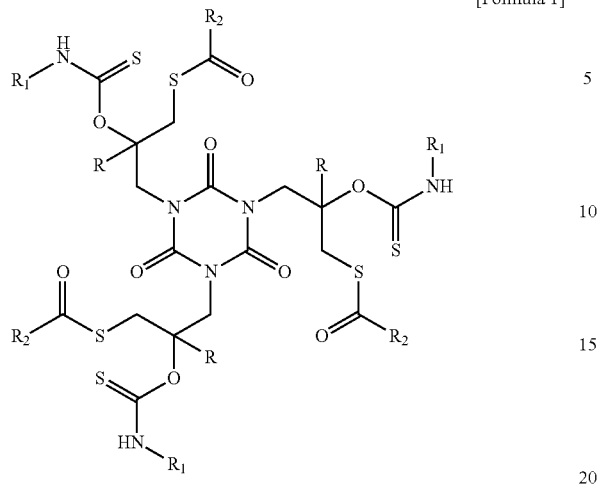

wherein in Formula 1, R is independently a hydrogen atom or a methyl group, $R_1$ has at least one connecting bond, and is independently a chain or cyclic saturated or unsaturated hydrocarbonyl group having 1 to 15 carbon atoms which contain 0 to 6 hetero atoms, and $R_2$ is —$CF_3$ or —$(CF_2)_3CF_3$; and removing the organic solvent from the coated composition for forming the resist underlayer film to harden the resist underlayer film.

* * * * *